US009426931B2

(12) United States Patent
Kaplun et al.

(10) Patent No.: US 9,426,931 B2
(45) Date of Patent: Aug. 23, 2016

(54) FLUID-FLOW-THROUGH COOLING OF CIRCUIT BOARDS

(71) Applicant: Lockheed Martin Corporation, Bethesda, MD (US)

(72) Inventors: Brian W. Kaplun, Endicott, NY (US); James S. Eiche, Apalachin, NY (US); David L. Vos, Apalachin, NY (US)

(73) Assignee: Lockheed Martin Corporation, Bethesda, MD (US)

(*) Notice: Subject to any disclaimer, the term of this patent is extended or adjusted under 35 U.S.C. 154(b) by 189 days.

(21) Appl. No.: 14/175,377

(22) Filed: Feb. 7, 2014

(65) Prior Publication Data

US 2015/0230365 A1 Aug. 13, 2015

(51) Int. Cl.
*H05K 7/20* (2006.01)
*B23P 15/26* (2006.01)

(52) U.S. Cl.
CPC ............ *H05K 7/20763* (2013.01); *B23P 15/26* (2013.01); *H05K 7/2039* (2013.01); *H05K 7/20272* (2013.01); *H05K 7/20563* (2013.01); *Y10T 29/4935* (2015.01)

(58) Field of Classification Search
CPC .......... H05K 7/20272; H05K 7/2039; H05K 7/20563; H05K 7/20763; H05K 7/20; H05K 7/20609; H05K 7/206; H05K 1/0272; H05K 2201/10969
USPC .......... 361/679.54, 689, 688, 694, 699, 704, 361/714, 719, 692, 707, 710, 715; 165/80.4
See application file for complete search history.

(56) References Cited

U.S. PATENT DOCUMENTS

| | | | |
|---|---|---|---|
| 3,648,113 A | 3/1972 | Rathjen et al. | |
| 5,424,916 A * | 6/1995 | Martin | ............... H05K 7/20636 165/80.4 |
| 6,246,582 B1 | 6/2001 | Habing et al. | |
| 6,621,706 B2 | 9/2003 | Tzlil et al. | |
| 6,768,642 B2 * | 7/2004 | Hines | ..................... G06F 1/184 165/185 |

(Continued)

OTHER PUBLICATIONS

Invitation to Pay Additional Fees for PCT/US2015/014667 mailed May 15, 2015.

(Continued)

*Primary Examiner* — Courtney Smith
*Assistant Examiner* — Michael Matey
(74) *Attorney, Agent, or Firm* — Wolf, Greenfield & Sacks, P.C.

(57) ABSTRACT

A disclosed apparatus for use with a conduction-cooled card assembly may include a frame comprising first and second thermally conductive portions adapted to engage respective thermal management interfaces on opposite sides of a conduction cooling frame for at least one circuit card. The apparatus may also include a passageway extending between first and second openings in the frame so as to allow cooling fluid to flow into the first opening, through the passageway, and out of the second opening. According to a disclosed method, an insert may be installed between components of a mezzanine connector so as to increase a height of the connector. In some implementations, the installing of the insert may be performed while the first and second components of the mezzanine connector are mounted on a host card and a mezzanine card, respectively, so that installation of the insert between the first and second components increases a spacing between the host card and the mezzanine card.

7 Claims, 10 Drawing Sheets

(56) References Cited

U.S. PATENT DOCUMENTS

| | | |
|---|---|---|
| 6,839,235 B2 | 1/2005 | St. Louis et al. |
| 7,349,221 B2 | 3/2008 | Yurko |
| 7,859,837 B2* | 12/2010 | Nemoz ............... H05K 7/20563 165/80.3 |
| 8,081,478 B1 | 12/2011 | Drexler et al. |
| 8,477,498 B2 | 7/2013 | Porreca et al. |
| 2004/0120116 A1* | 6/2004 | St. Louis ........... H05K 7/20672 361/700 |
| 2007/0070601 A1* | 3/2007 | Vos ................... H05K 7/20563 361/694 |
| 2007/0297137 A1* | 12/2007 | Glahn ................ H05K 7/1404 361/699 |
| 2008/0218980 A1* | 9/2008 | Tracewell .......... H05K 7/20672 361/713 |
| 2008/0304223 A1 | 12/2008 | Franz et al. |
| 2009/0147472 A1 | 6/2009 | Mantych et al. |
| 2009/0166021 A1 | 7/2009 | Slaton et al. |
| 2009/0225510 A1* | 9/2009 | Biemer .............. H05K 7/20563 361/690 |
| 2009/0296345 A1 | 12/2009 | Nguyen et al. |
| 2010/0290186 A1 | 11/2010 | Zeng et al. |
| 2011/0228474 A1* | 9/2011 | Leibowitz .............. G06F 1/186 361/689 |
| 2012/0300402 A1 | 11/2012 | Vos |
| 2014/0036444 A1 | 2/2014 | Nishio |

OTHER PUBLICATIONS

PCT/US2015/014667, Sep. 15, 2015, International Search Report and Written Opinion.

PCT/US2015/014667, May 15, 2015, Invitation to Pay Additional Fees.

* cited by examiner

FLUID-FLOW-THROUGH COOLING OF CIRCUIT BOARDS

FIELD

This disclosure relates generally to cooling of circuit boards, and more particularly, to novel apparatuses and techniques that allow circuit boards designed for conduction cooling to be used in a fluid-flow-through cooling environment.

BACKGROUND

Figure 1:
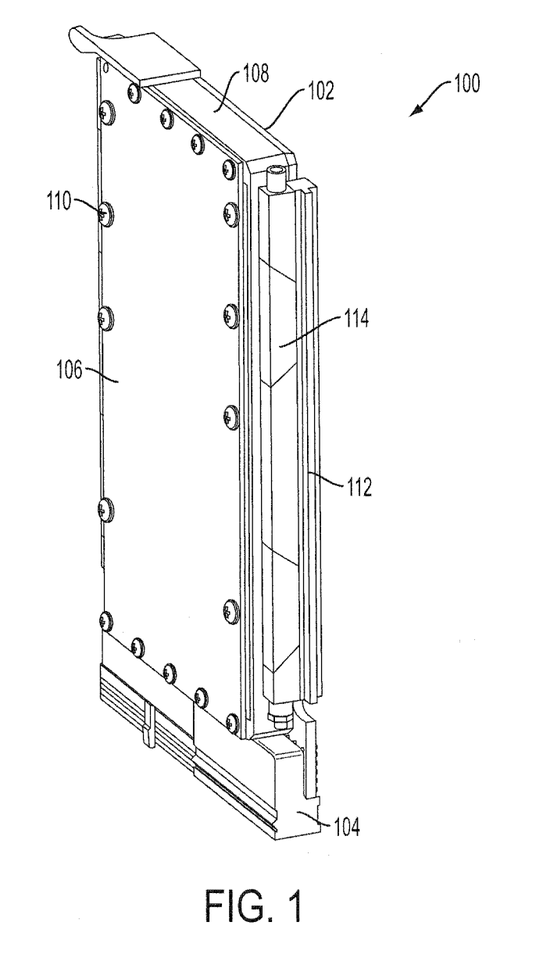
FIG. 1 is a perspective view of a conventional conduction-cooled card assembly.

Proper thermal management is critical to the successful operation of many types of devices. Standard industry practice for cooling ruggedized avionics modules, for example, is using a conduction cooling frame that is bonded to a printed circuit board to conduct heat out to an external chassis via a standard interface. An example of such a conventional conduction-cooled card assembly 100 is shown in FIG. 1. As shown, the assembly 100 includes a primary, or host, card 102 having a multi-electrode electrical connector 104 for establishing a Peripheral Component Interconnect (PCI) bus connection with a motherboard of a chassis (not shown). A secondary, or mezzanine, card 106, is electrically connected with the primary card 102 via PCI Mezzanine Card (PMC) or switched mezzanine card (XMC) connectors (not shown in FIG. 1) disposed between the cards 102, 106. The primary card 102 and secondary card 106 are both mounted to a conduction cooling frame 108 using screws 110. Typically, electrical components are mounted on the opposing faces of the cards 102, 106, within the cavity formed between them. As shown, the conduction cooling frame 108 includes thermal management interfaces 112 each having a wedgelock fastener 114 secured to it via screws (not shown). The wedgelock fasteners 114 are used to press the thermal management interfaces 112 against the rails of the chassis so as to allow heat to flow to the chassis through the thermal management interfaces 112.

U.S. Pat. No. 7,324,336 ("the '336 patent") proposed an adaptor frame that can be used to allow a conduction-cooled card assembly to be installed in a certain type of air-flow cooled chassis. With reference to its FIG. 1, the '336 patent explains that wedgelock fasteners 42, 44 attached to extensions 24a, 24b of thermally conductive plate 24 can be used to secure an adaptor housing 60 between the extensions 24a, 24b and rails 34, thus allowing heat from components on circuit cards 20, 22 to be conducted from the plate 24 to the housing 60 and extracted via air flowing through the housing 60.

Another known approach for allowing cards of conduction-cooled card assemblies, such as cards 102, 106 of assembly 100 shown in FIG. 1, to be employed within an air-cooled chassis is to replace the mezzanine connectors on one or both of the cards with taller connectors so as to create a gap that allows air to flow between the cards, and to mount the cards on a different frame that is designed to allow air to flow between the cards from one side of the chassis to the other.

SUMMARY

In some embodiments, an apparatus for use with a conduction-cooled card assembly may include a frame comprising first and second thermally conductive portions adapted to engage respective thermal management interfaces on opposite sides of a conduction cooling frame for at least one circuit card. The apparatus may also include a passageway extending between first and second openings in the frame so as to allow cooling fluid to flow into the first opening, through the passageway, and out of the second opening. The frame may be configured and arranged to be removably installable between opposing interior walls of a chassis and may be further configured and arranged so that the first and second openings can mate with corresponding openings on the opposing interior walls of the chassis when the frame is installed in the chassis.

In some embodiments, a method may involve acts of: (a) removing a wedgelock fastener from a thermal management interface of a conduction-cooled card assembly; and (b) attaching a frame having a passageway extending therethrough to the thermal management interface so as to allow heat from thermal management interface to be dissipated via fluid flowing through the passageway.

In some embodiments, a method may comprise an act of installing an insert between components of a mezzanine connector so as to increase a height of the connector. In some implementations, the installing of the insert may be performed while the first and second components of the mezzanine connector are mounted on a host card and a mezzanine card, respectively, so that installation of the insert between the first and second components increases a spacing between the host card and the mezzanine card.

The foregoing is a non-limiting summary of various embodiments, some of which are defined by the attached claims

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Although suitable for some applications, the inventors have recognized certain limitations and disadvantages to the conventional approaches discussed above for allowing conduction-cooled card assemblies or circuit cards from such assemblies to be deployed within an air-cooled chassis environment, and have thus come up with alternative solutions that may provide significant benefits and advantages in at least some circumstances.

In accordance with some embodiments disclosed herein, an adaptor frame is provided that can be mounted to wedgelock locations on a conduction-cooled card assembly, such as the assembly 100 shown in FIG. 1. In some embodiments, for example, the wedgelock fasteners 114 may be removed from the assembly 100 and replaced with an adaptor frame such as that disclosed herein. In some embodiments, the adaptor frame may be attached to the card assembly 100 via fasteners that interface with same mounting points on the thermal management interfaces 112 as did the removed wedgelock fasteners 114.

Figure 2:
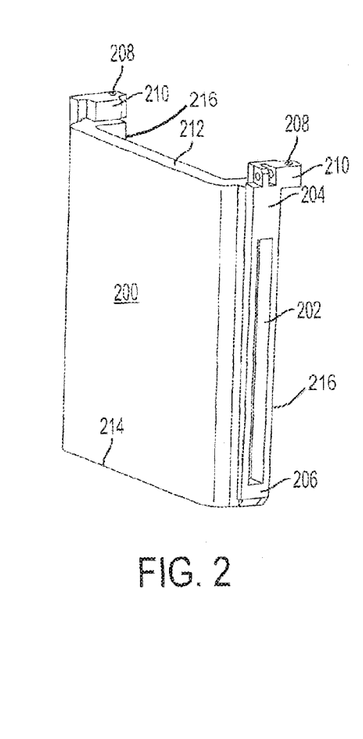
FIG. 2 is a perspective view of an example of a novel adaptor frame disclosed herein.
Figure 3:
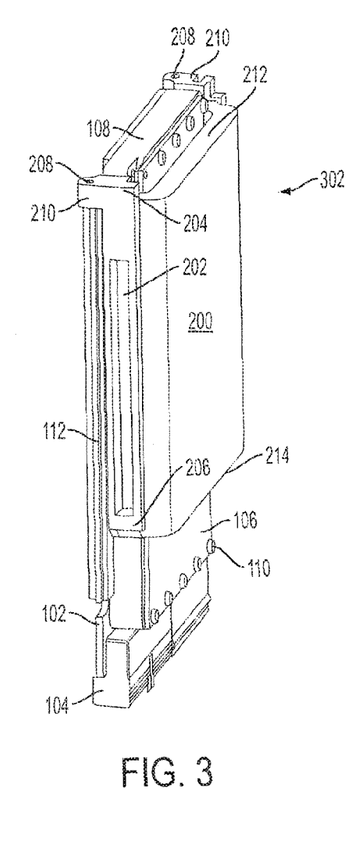
FIG. 3 is a perspective view of an example of a module in which the adaptor frame of FIG. 2 is mounted on a conduction-cooled card assembly.
Figure 4A:
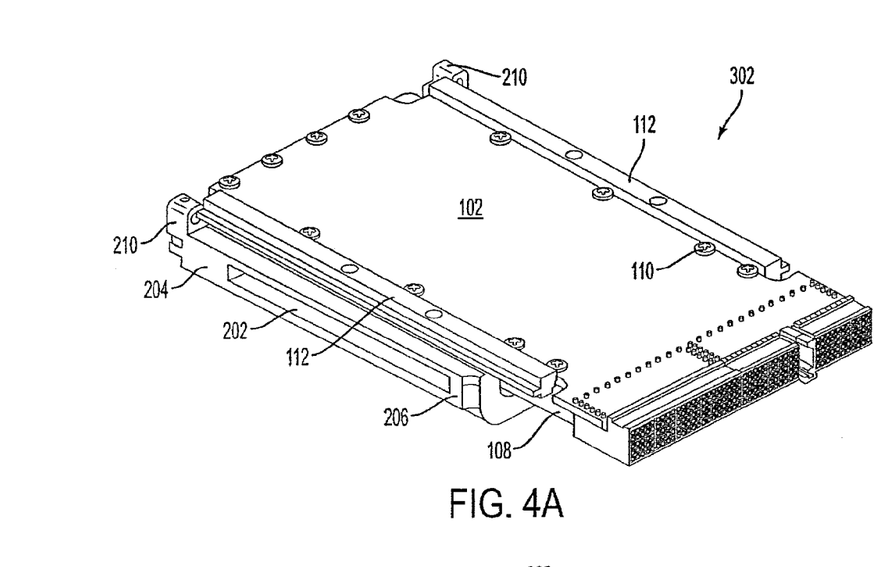
FIG. 4A is a bottom perspective view of the module shown in FIG. 3.
Figure 4B:
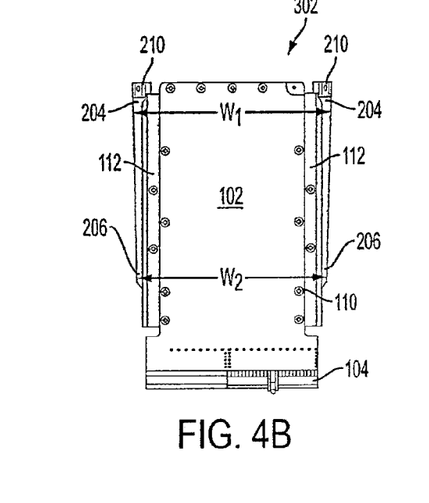
FIG. 4B is a bottom view of the module shown in FIG. 3.
Figure 4C:
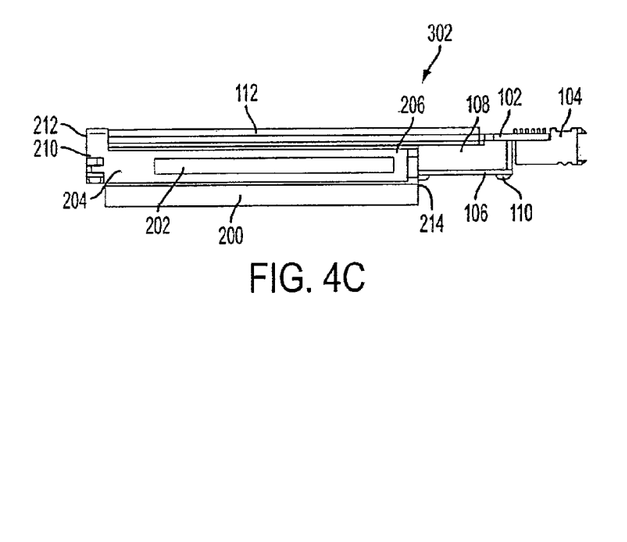
FIG. 4C is a first side view of the module shown in FIG. 3.
Figure 4D:
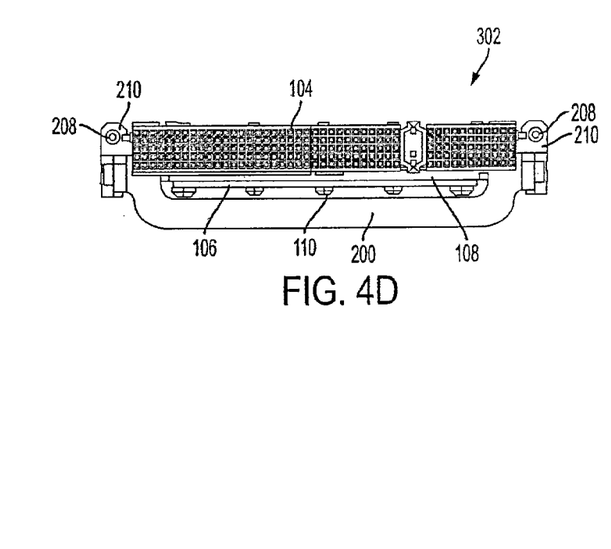
FIG. 4D is a first rear view of the module shown in FIG. 3.
Figures 5A, 5B, 5C, 5D:
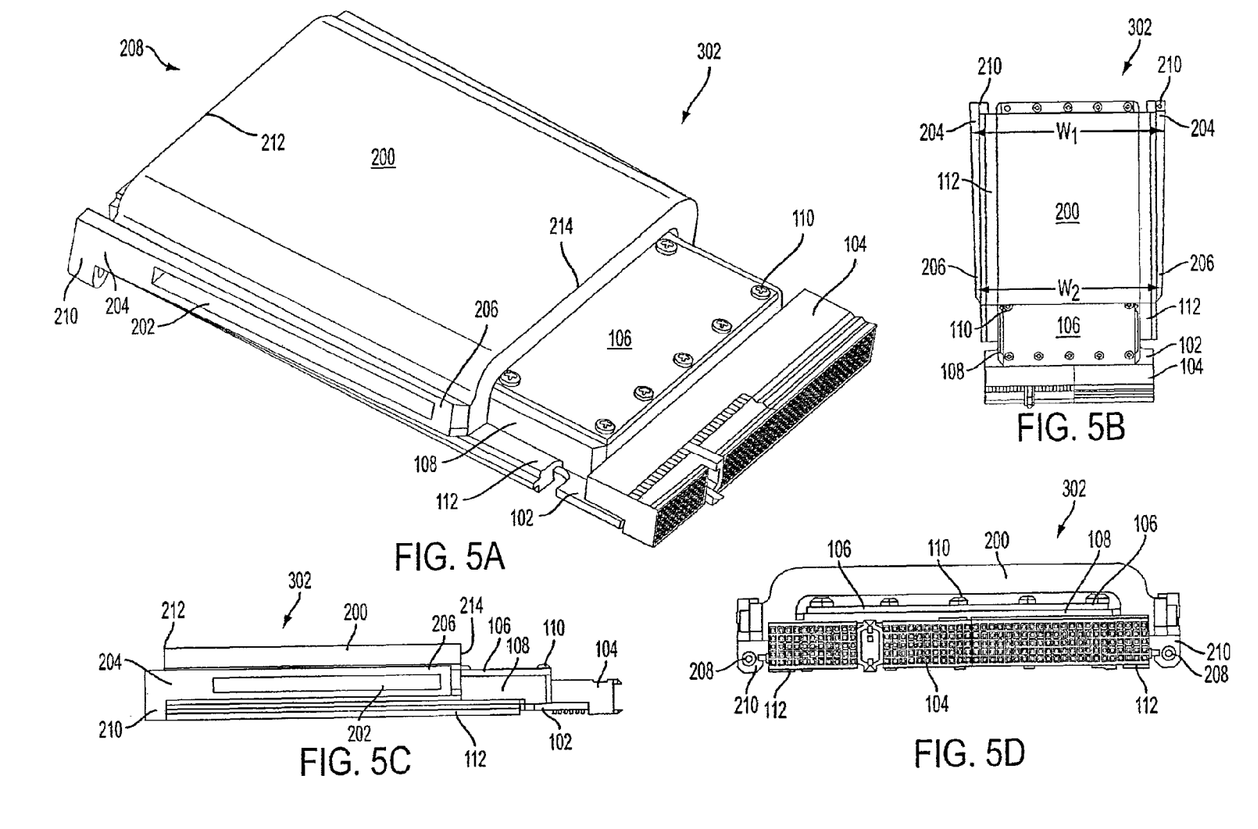
FIG. 5A is a top perspective view of the module shown in FIG. 3.
FIG. 5B is a top view of the module shown in FIG. 3.
FIG. 5C is a second side view of the module shown in FIG. 3.
FIG. 5D is a second rear view of the module shown in FIG. 3.

An example embodiment of such an adaptor frame 200 is shown in FIG. 2. Various views of a module 302 including the frame 200 mounted on a conduction-cooled card assembly 100 (with the wedgelock fasteners 114 removed) are shown in FIGS. 3-5. Specifically, FIG. 3 is a perspective view of an example of a module in which the adaptor frame of FIG. 2 is mounted on a conduction-cooled card assembly; FIGS. 4A and 5A are bottom and top perspective views, respectively, of the module shown in FIG. 3; FIGS. 4B and 5B are bottom and top views, respectively, of the module shown in FIG. 3; FIGS. 4C and 5C are side views of the module shown in FIG. 3; and FIGS. 4D and 5D are rear views of the module shown in FIG. 3.

Figure 6:
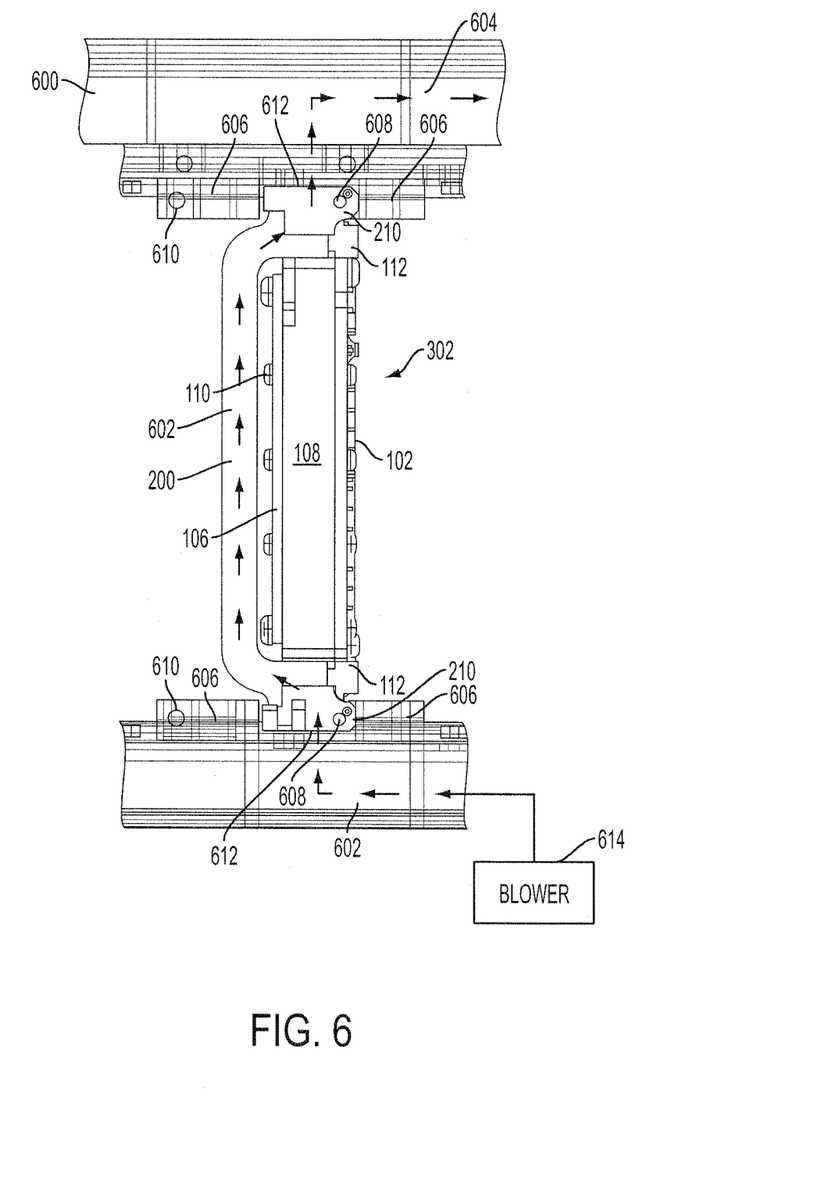
FIG. 6 is cut-away side view illustrating how cooling fluid may flow through the frame of FIG. 2 when it is installed within a fluid-flow-through cooled chassis.

FIG. 6 illustrates how air may flow through the adaptor frame 200 from one side 602 of a chassis 600 to the other side 604 of the chassis 600 in the illustrative embodiment shown.

As shown in FIGS. 2, 3, 4A, 4C, 5A, and 5C, the frame 200 may include openings 202 on either side and form a passageway 602 (see FIG. 6) that allows air (e.g., supplied by a blower 614) or another suitable cooling fluid to flow from one side to the other through the passageway, as illustrated by the arrows in FIG. 6. In some embodiments, the planes occupied by the openings 202 may be oriented substantially orthogonal to the planes in which the cards 102, 106 are disposed. Such a configuration may, for example, allow air to flow into the passageway 602 without first having to flow into one of the struts 606, thus increasing the linearity and efficiency of the air flow. When the frame 200 is installed on a conduction-cooled card assembly 100, heat from components on the cards 102, 106 may flow to the conduction cooling frame 108, to the thermal management interfaces 112, and then to the frame 200 where it is dissipated into the air or other fluid flowing through the passageway 602 of the frame 200.

Although not illustrated, the frame 200 may include fins or other protrusions within the interior of the passageway 602 so as to increase the surface area of the interior portion of the frame 200 exposed to the fluid flowing through it and thereby increase the amount of heat that may be dissipated via the moving fluid. The frame 200 may be made of any suitable material capable of adequately conducting heat from the thermal management interfaces 112 and allowing the heat so conducted to be dissipated via fluid flowing through the passageway 602. In some embodiments, for example, the frame 200 may be made of aluminum. As shown in FIG. 2, thermally conductive portions 216 of the frame 200 may be adapted to engage the thermal management interfaces 112. The interface between the frame 200 and the thermal management interfaces 112 may be dry, or may alternatively be treated in some way so as to improve the thermal conductivity between the interfacing materials.

As illustrated best in FIGS. 4B and 5B, the portions of the frame 200 including the openings 202 may be tapered between a point 204 and a point 206, with the section at the point 204 being thicker than the section at the point 206. Because of these tapered portions, the end 212 of the frame 200 that is further away from the motherboard connector 104 is wider than the end 214 of the frame 200 that is closer to a motherboard connector 104 (compare measurements "$W_1$" and "$W_2$" in FIGS. 4B and 5B, where "$W_1$">"$W_2$").

In some embodiments, these tapered portions of the frame 200 may be formed of an elastomeric material and the openings 202 may include gaskets that create seals with corresponding openings in interior opposing walls 612 of the chassis 600 in which the module 302 is installed. Insertion of a module 302 in a slot between struts 606 of a chassis 600 (as shown in FIG. 6) may, for example, result in the deformation of the elastomeric material and thereby create a force that holds the module 302 in place within the chassis 600. In some embodiments, the portions of the chassis 600 containing corresponding openings may be additionally or alternatively formed of a suitable elastomeric material and the tapered portions of the frame need not, but may also be, elastomeric. In any event, in some embodiments, once a module 302 is fully inserted in a slot of a chassis 600, captivated screws 608 (shown in FIG. 6) may be inserted through holes 208 in ear portions 210 of the frame 200 and corresponding holes 610 in a strut 606 of the chassis 600 (the holes 610 for an adjacent slot of the chassis 600 are identified in FIG. 6) to thereby secure the module 302 within the slot.

In the embodiment shown in FIGS. 2-6, the module 302 may be held in place within the chassis, and the gasket seals between the openings 202 and the corresponding openings in the interior walls 612 of the chassis may be maintained, by a vertical force applied against the interior walls 612 of the chassis, e.g., via the elastomeric material on the edge of the frame 200 and/or the chassis interior walls 612. The use of such a vertical force for such purposes may be contrasted with the technique employed in the embodiment shown in FIG. 1 of the '336 patent, in which wedgelock fasteners 34 are used to apply horizontal forces between rails 34 so as to hold a plate 24 and cooling adaptor 40 in place within the chassis as well as to maintain seals between each of an inlet 84 and an outlet 86 of the cooling adaptor 40 and a corresponding opening in the side of a rails 34. Accordingly, in some embodiments, a wedgelock faster 114 need not be employed to secure the module 302 within the chassis and/or to form a suitable gasket seal to allow air flow through the passageway 602. In alternative embodiments, however, one or more wedgelock fasteners 114 could be additionally or alternatively be employed so as to provide additional or different benefits.

As noted above, another known approach for allowing cards of conduction-cooled card assemblies, such as cards 102, 106 of assembly 100 shown in FIG. 1, to be employed within an fluid-flow-through cooled chassis is to replace the mezzanine connectors (e.g., PMC or XMC connectors) on one or both of the cards with taller connectors so as to create a gap that allows air to flow between the cards, and to mount the cards on a different frame that is designed to allow air to flow between the cards from one side of the chassis to the other. Without such a modification, the existing mezzanine connectors, which typically provide only a 10 mm space between the cards, do not provide sufficient room for airflow between the cards for certain applications.

The inventors have recognized, however, that replacing the mezzanine connectors in such a manner (e.g., by unsoldering the Ball Grid Array (BGA) connections of the mezzanine connectors and soldering new BGA connections for replacement mezzanine connectors in place) can be undesirable, as such a procedure can be expensive, could potentially damage the board, and may lead to the board supplier voiding its manufacturing warranty.

To overcome such drawbacks, an insert is proposed that may be plugged into an existing mezzanine connector so as to extend the height of the connector to an optimal position to allow flow of air or another suitable fluid between a primary, or host, card 102, and a secondary, or mezzanine, card 106, when those cards are mounted on a frame that allows for such fluid flow. In some embodiments, for example, one or more inserts that are approximately 8 mm in length may be employed so as to create a gap of approximately 18 mm between the two cards. Different length inserts can, of course, be used for other applications where more or less fluid flow is desired. In some embodiments, for instance, the insert(s) may alternatively be sized such that the resulting spacing between the cards is 11 mm, 12 mm, 13, mm, 14 mm, 15 mm, 16 mm, 17 mm, 19 mm, 20 mm, or any other suitable distance.

Figure 7A:
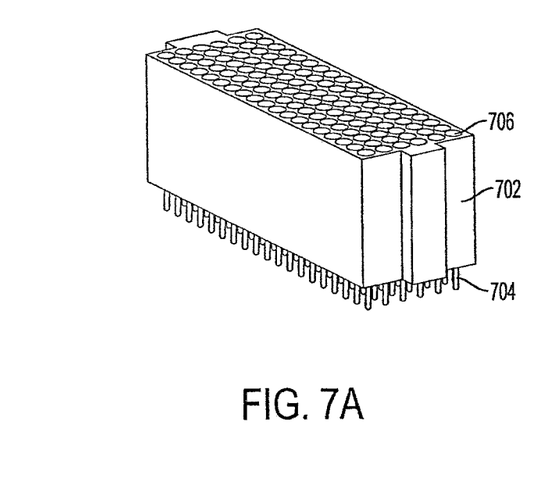
FIG. 7A is a first perspective view of an example of a novel insert disclosed herein.
Figure 7B:
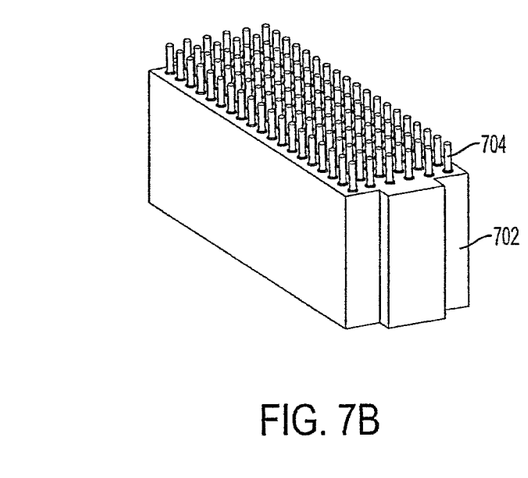
FIG. 7B is a second perspective view of the insert shown in FIG. 7A.

Two views of an example embodiment of insert 702 are shown in FIGS. 7A and 7B. As shown, the insert 702 includes pins 704 and holes 706 that may mate with corresponding holes and pins in the mezzanine connector into which it is to be plugged.

Figure 8:
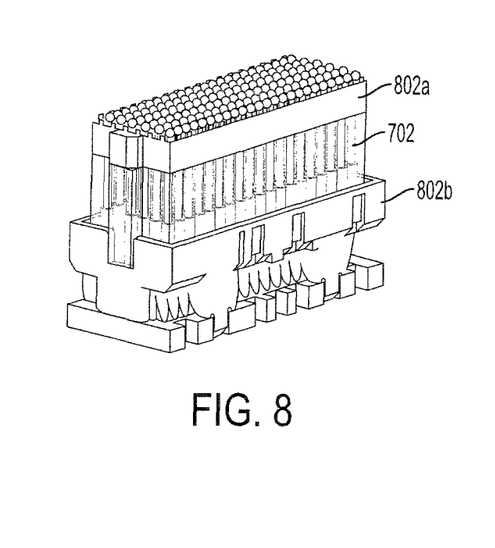
FIG. 8 is a perspective view illustrating how the insert of FIG. 8 can be installed between components of a mezzanine connector.
Figure 9:
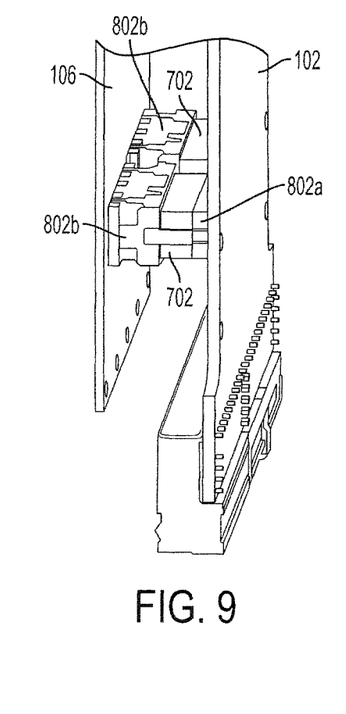
FIG. 9 is a perspective view illustrating how the assembly of FIG. 8 can be installed between a host card and a mezzanine card.
Figure 10:
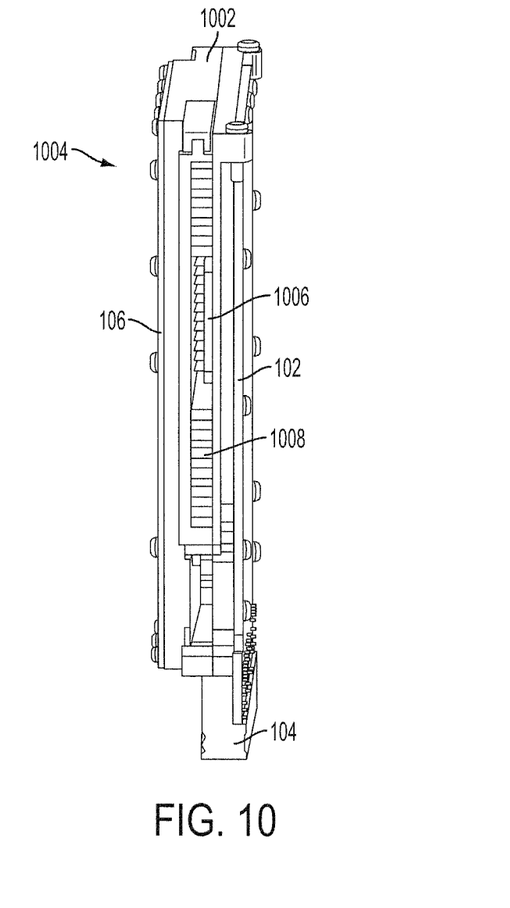
FIG. 10 is a perspective view illustrating how the assembly of FIG. 9 can be mounted on a frame so as to allow it to be deployed in a fluid-flow-through cooled chassis.
Figure 11A:
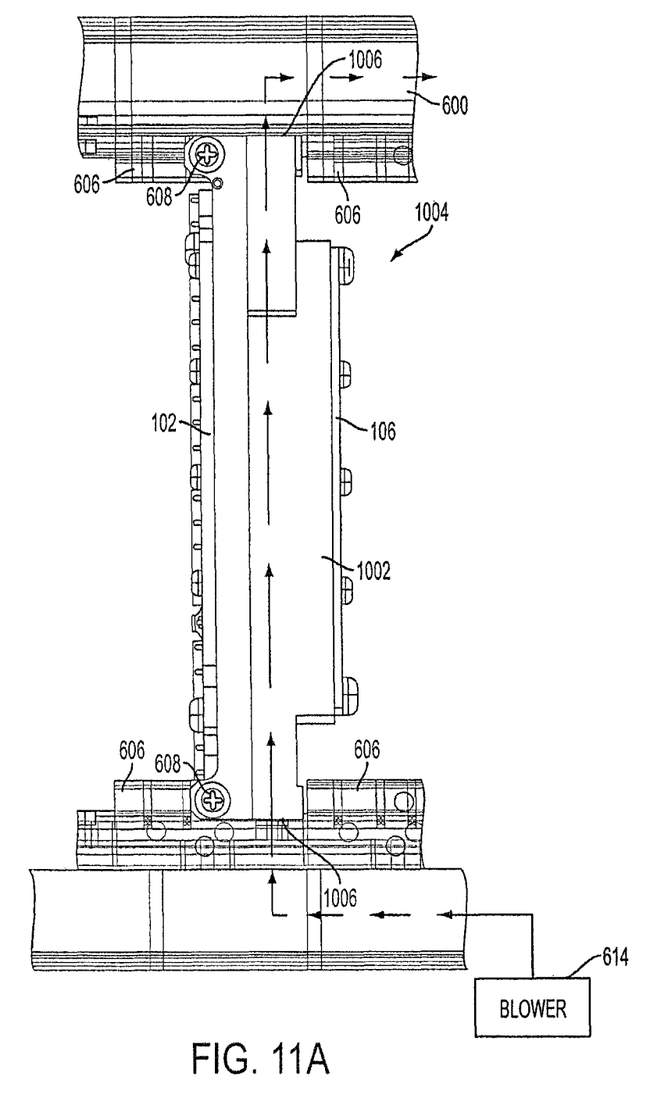
FIG. 11A is a first side view illustrating how cooling fluid may flow through the assembly of FIG. 10 when it is installed within a fluid-flow-through cooled chassis.
Figure 11B:
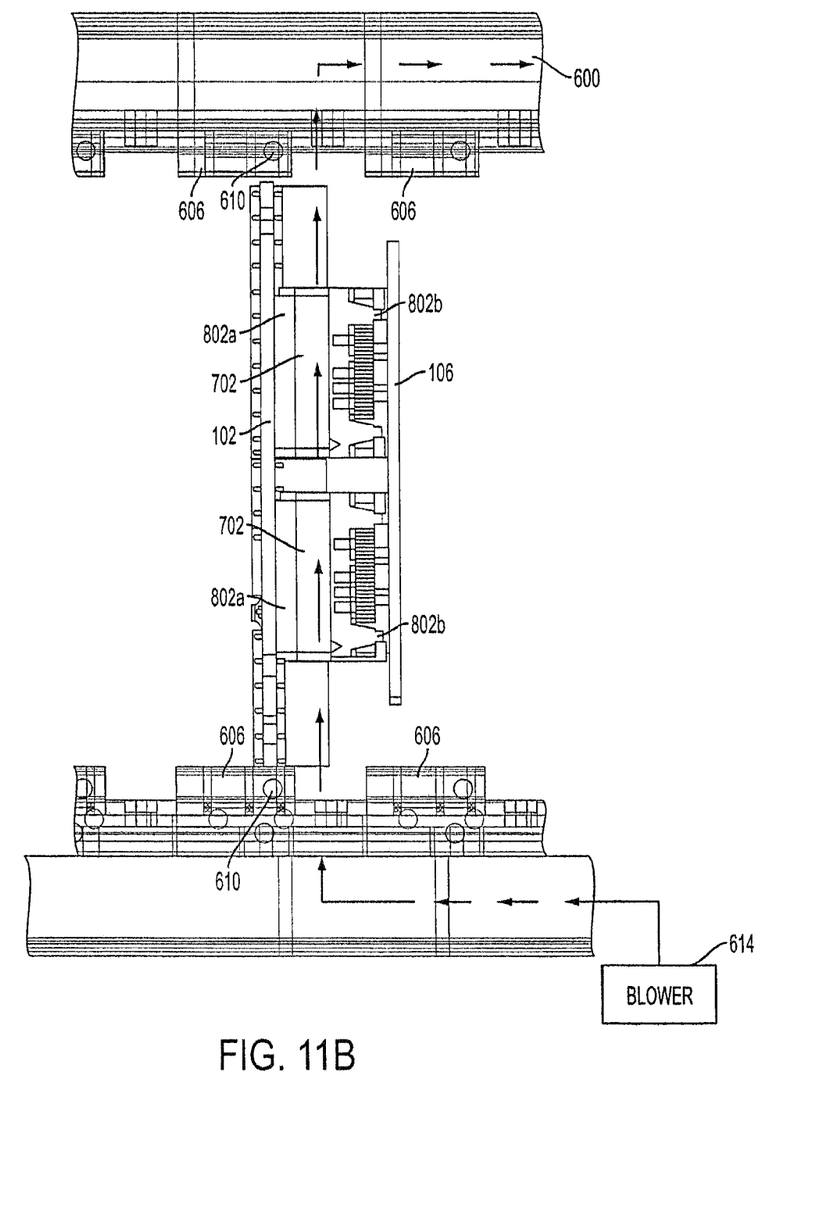
FIG. 11B is a second side view of the assembly of FIG. 10 which excludes the frame of the assembly so as to reveal the internal components of the assembly for illustrative purposes.

FIG. 8 illustrates how an insert 702 such as that shown in FIG. 7 may be disposed between respective mating portions 802a, 802b of a mezzanine connector 802. FIG. 9 illustrates how the use of inserts 702 can increase the spacing between a primary card 102 and a secondary card 106. FIG. 10 shows an example of how two cards 102, 106 having an additional spacing provided by inserts 702 can be mounted on a frame 1002 so as to form a card assembly 1004 that allows fluid to flow from one side of a chassis to another when inserted into an fluid-flow-through cooled chassis. FIGS. 11A-B are side views illustrating how cooling fluid (e.g., air supplied by the blower 614) may flow through the assembly of FIG. 10 (in the direction indicated by the arrows) when it is installed within a fluid-flow-through cooled chassis 600. FIG. 11A illustrates the assembly 1004 including the frame 1002. FIG. 11B excludes the frame 1002 so as to reveal the internal components of the assembly 1004 for illustrative purposes.

As shown if FIGS. 10 and 11, the assembly 1004 may have openings 1006 on either side that may mate with corresponding openings in a chassis 600. As also shown in FIG. 10, the frame 1002 may additionally comprise fins 1008 or other protrusions to increase the surface area of the inner part of the frame 1002 that is exposed to the air or other cooling fluid flowing between the cards 102, 106. In some embodiments, the frame 1002 can further be provided with elastomeric, tapered edges and holes to receive captivated screws 608, generally configured like the corresponding components of the module 302 discussed above in connection with FIGS. 2-6, so as to allow the assembly 1004 to be releasably inserted into and maintained in place within the same type of chassis 600 as the module 302 discussed above. In the embodiments shown, heat from components on the circuit cards 102, 106 may be dissipated via the fluid flowing through the frame 1002 between the cards 102, 106.

Having thus described several aspects of at least one embodiment of this invention, it is to be appreciated that various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

Various aspects of the present invention may be used alone, in combination, or in a variety of arrangements not specifically discussed in the embodiments described in the foregoing and is therefore not limited in this application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc. in the claims to modify a claim element does not by itself connote any priority, precedence or order of one claim element over another or the temporal order in which acts of a method are performed, but are used merely as labels to distinguish one claimed element having a certain name from another element having a same name (but for use of the ordinal term) to distinguish the claim elements.

Also, the phraseology and terminology used herein is used for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. An apparatus for use with a conduction-cooled card assembly, comprising:
    an adaptor frame comprising first and second thermally conductive portions to engage respective thermal management interfaces on opposite sides of a conduction cooling frame for at least one circuit card; and a passageway extending between first and second openings in the adaptor frame so as to allow cooling fluid to flow into the first opening, through the passageway, and out of the second opening;

wherein the adaptor frame is arranged to be removably installable between opposing interior walls of a chassis and is further arranged so that the first and second openings can mate with corresponding openings in first and second planar portions of the opposing interior walls of the chassis when the adaptor frame is installed in the chassis and the first and second planar portions of the opposing interior walls of the chassis are disposed in two different, parallel planes, the adaptor frame has a first end to engage the opposing interior walls of the chassis at a first location, and a second end to engage the opposing interior walls of the chassis at a second location that is closer to a motherboard of the chassis than the first location, and a width of the first end of the adaptor frame is greater than a width of the second end of the adaptor frame.

2. The apparatus of claim 1, in combination with the at least one circuit card, wherein the at least one circuit card is thermally coupled to the conduction cooling frame so as to allow heat from electronic components on the at least one circuit card to flow to the thermal management interface via the conduction cooling frame, and wherein at least one of the first and second openings is disposed in a plane that is substantially orthogonal to a plane occupied by the at least one circuit card.

3. The apparatus of claim 2, wherein the at least one circuit card comprises a first card thermally coupled to the conduction cooling frame and having a multi-electrode electrical connector to establish a bus connection with a motherboard of the chassis.

4. The apparatus of claim 2, wherein the at least one circuit card further comprises a second card parallel to and electrically coupled to the first card and thermally coupled to the conduction cooling frame.

5. The apparatus of claim 2, wherein the first card is a host card, the second card is a mezzanine card, and the apparatus further comprises at least one mezzanine connector arranged to electrically couple the mezzanine card to the host card.

6. The apparatus of claim 1, wherein at least one edge of the frame between the first and second ends comprises an elastomeric material that is to deform as it contacts the opposing interior walls when the adaptor frame is installed in the chassis.

7. The apparatus of claim 6, wherein the elastomeric material is to form a gasket seal between the first and second openings and the corresponding openings on the opposing interior walls of the chassis when the adaptor frame is installed in the chassis.

* * * * *